(12) United States Patent
Chen et al.

(10) Patent No.: US 8,659,125 B2
(45) Date of Patent: Feb. 25, 2014

(54) CHIPSET PACKAGE STRUCTURE

(75) Inventors: Wen-Hua Chen, Beijing (CN);
Zheng-He Feng, Beijing (CN);
Ping-Yang Chuang, Taipei Hsien (TW)

(73) Assignees: Tsinghua University, Beijing (CN);
Hon Hai Precision Industry Co., Ltd.,
New Taipei (TW)

( * ) Notice: Subject to any disclaimer, the term of this patent is extended or adjusted under 35 U.S.C. 154(b) by 528 days.

(21) Appl. No.: 12/248,799

(22) Filed: Oct. 9, 2008

(65) Prior Publication Data
US 2009/0166819 A1 Jul. 2, 2009

(30) Foreign Application Priority Data

Dec. 29, 2007 (CN) .......................... 2007 1 0125663

(51) Int. Cl.
*H01L 23/552* (2006.01)
(52) U.S. Cl.
USPC ............ 257/659; 257/E23.114; 257/E23.117; 257/E23.121
(58) Field of Classification Search
USPC .......... 257/659, E23.114, 798, 790, E23.117, 257/E23.121
See application file for complete search history.

(56) References Cited

U.S. PATENT DOCUMENTS

| | | | |
|---|---|---|---|
| 5,677,511 A * | 10/1997 | Taylor et al. ................... | 174/527 |
| 6,455,864 B1 * | 9/2002 | Featherby et al. .......... | 250/515.1 |
| 6,538,262 B1 | 3/2003 | Crespi et al. | |
| 2002/0151634 A1 * | 10/2002 | Rohrbaugh et al. .......... | 524/430 |
| 2004/0028859 A1 * | 2/2004 | LeGrande et al. .......... | 428/36.91 |
| 2004/0053780 A1 * | 3/2004 | Jiang et al. .................... | 502/182 |
| 2004/0251522 A1 * | 12/2004 | Legaspi et al. ................ | 257/659 |
| 2004/0265489 A1 * | 12/2004 | Dubin ........................... | 427/212 |
| 2006/0033203 A1 * | 2/2006 | Leu et al. ....................... | 257/706 |
| 2006/0212974 A1 * | 9/2006 | Kawabata et al. ............ | 977/742 |
| 2006/0269668 A1 | 11/2006 | Jiang et al. | |
| 2007/0069353 A1 * | 3/2007 | Beer et al. ..................... | 257/678 |
| 2007/0144780 A1 * | 6/2007 | Jiang et al. .................. | 174/94 R |
| 2008/0248235 A1 * | 10/2008 | Feng et al. .................... | 428/113 |
| 2009/0092813 A1 * | 4/2009 | Lin et al. ....................... | 428/220 |
| 2009/0212401 A1 * | 8/2009 | Do et al. ....................... | 257/659 |

FOREIGN PATENT DOCUMENTS

CN 1734754 A 2/2006

* cited by examiner

*Primary Examiner* — Wael Fahmy
*Assistant Examiner* — Sarah Salerno
(74) *Attorney, Agent, or Firm* — Altis Law Group, Inc.

(57) ABSTRACT

A chipset package structure includes a carrier, a plurality of pinouts, at least one semiconductor package preforms, at least one electromagnetic shielding layer and a protective layer. The pinouts are disposed on the carrier. The semiconductor package preforms is disposed on the second surface of the carrier and electrically connected to the pinouts. The electromagnetic shielding layer is disposed on the semiconductor package preforms and the electromagnetic shielding layer. At least one of the electromagnetic shielding layers comprises a carbon nanotube film structure. The protective layer covers the electromagnetic shielding layer.

20 Claims, 7 Drawing Sheets

CHIPSET PACKAGE STRUCTURE

BACKGROUND

1. Field of the Invention

The invention generally relates to a chipset package structure, particularly, relates to a chipset package structure based on carbon nanotubes.

2. Discussion of Related Art

In this fast and ever-changing society, information matters to all people. Many types of portable electronic devices are produced which attempt to catch up with our desires to transmit and receive more data. Presently, manufacturers have to factor into their chip package many design concepts such as digital architecture, network organization, local area connection, and personalized electronic devices. However, as density of each package continues to increase, EMI (Electro Magnetic Interference) and heat dissipation become major problems facing chip manufacturers.

Referring to FIG. 7, a conventional chipset package structure 10, according to the prior art, includes a carrier 102, a plurality of conductive traces (not shown), a plurality of pinouts 116, a chipset 104, a plurality of conductive wires 106, an encapsulating layer 108, an electromagnetic shielding layer 110 and a protective layer 112. The conductive traces are disposed on the carrier 102. The pinouts 116 are electrically connected to the conductive traces. The chipset 104 includes a plurality of bonding pads (not shown). The conductive wires 106 are deployed to connect various bonding pads to corresponding conductive traces so that the chipset 104 is electrically connected to the carrier 102. The encapsulating layer 108 is formed over the carrier 102 to cover the chipset 104 and the conductive wires 106. The electromagnetic shielding layer 110 covers the whole encapsulating layer 108. The protective layer 112 covers the electromagnetic shielding layer 110. The electromagnetic shielding layer 110 is grounded and can prevent electromagnetic waves from getting out of the chipset package structure 10.

In the conventional chipset package structure 10, the electromagnetic shielding layer 110 is a metal layer, an alloy layer, or an organic material layer filled with porous metal particles. The organic material is resin.

However, the conventional chipset package structure 10 has the following disadvantages. Firstly, the metal or alloy layer cannot absorb electromagnetic waves. So, the electromagnetic waves will be reflected in the chipset package structure 10 endlessly to produce heat and may diminish the transmission properties of the chipset 104 and the conductive wires 106. Secondly, the metal or alloy layer is a significant portion of the weight of the chipset package structure 10. Thirdly, organic material layers filled with porous metal particles are difficult to fabricate and relatively heavy.

What is needed, therefore, is a chipset package structure that will reduce electromagnetic interference.

BRIEF DESCRIPTION OF THE DRAWINGS

Many aspects of the present chipset package structure can be better understood with references to the following drawings. The components in the drawings are not necessarily drawn to scale, the emphasis instead being placed upon clearly illustrating the principles of the present chipset package structures.

Figure 1:
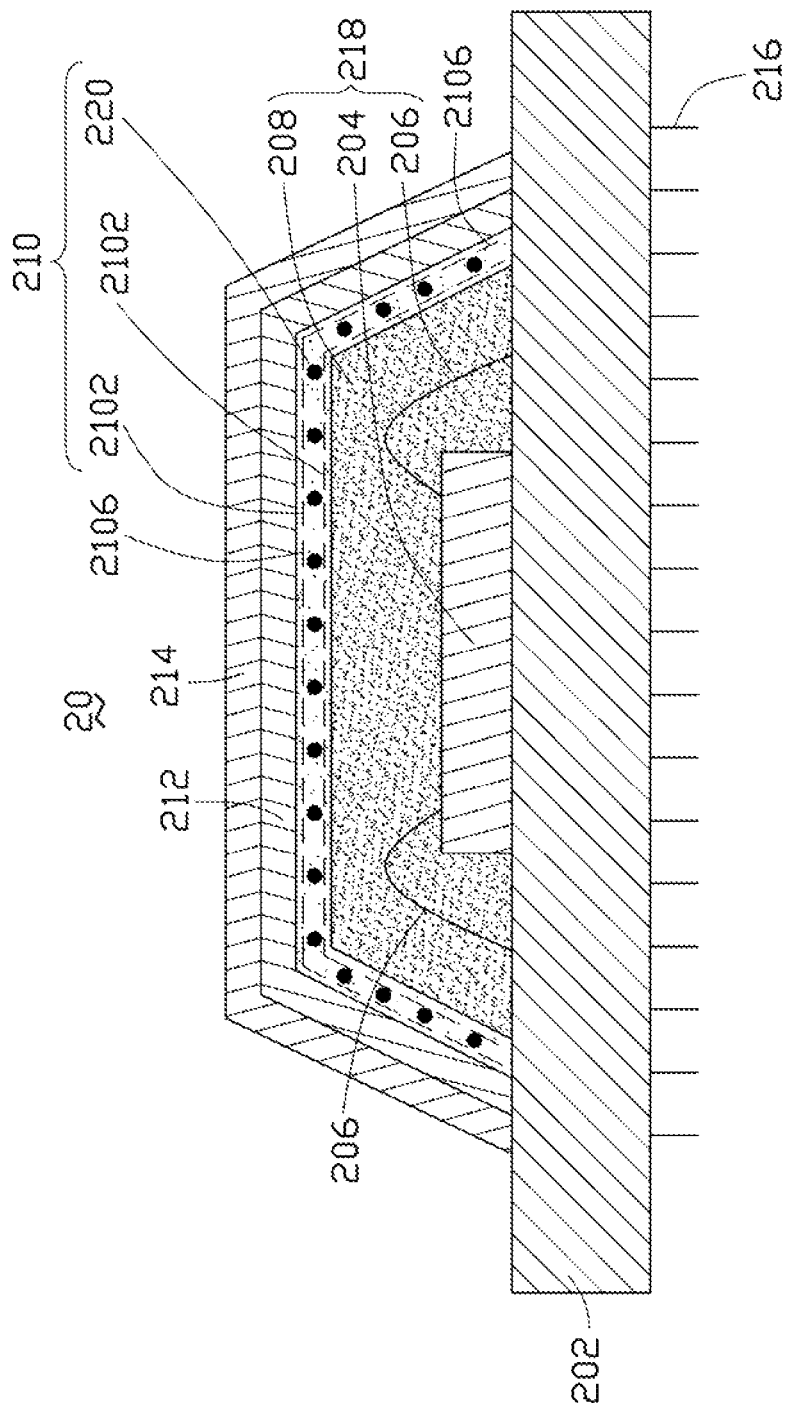
FIG. 1 is a schematic view of a chipset package structure in accordance with the first embodiment.

Corresponding reference characters indicate corresponding parts throughout the several views. The exemplifications set out herein illustrate at least one present embodiment of the chipset package structure, in at least one form, and such exemplifications are not to be construed as limiting the scope of the invention in any manner.

DETAILED DESCRIPTION OF EXEMPLARY EMBODIMENTS

References will now be made to the drawings, in detail, to describe embodiments of the chipset package structures.

Referring to FIG. 1, a chipset package structure 20 is provided in the first embodiment. The chipset package structure 20 includes a carrier 202 comprising a first surface and a second surface, a semiconductor package preform 218, an electromagnetic shielding layer 210, and a protective layer 212. A plurality of conductive traces (not shown) is disposed on/in the carrier 202. A plurality of pinouts 216 is disposed on the first surface of the carrier 202 and electrically connected to the conductive traces. The semiconductor package preform 218 is disposed on the second surface of the carrier 202 and electrically connected to the conductive traces. The electromagnetic shielding layer 210 is formed over the semiconductor package preform 218 to cover the semiconductor package preform 218. The protective layer 212 is configured to cover the whole of the electromagnetic shielding layer 210. The semiconductor package preform 218 includes a chipset 204, a plurality of conductive wires 206, and an encapsulating layer 208 covering the chipset 204 and the conductive wires 206. The chipset 204 includes a plurality of bonding pads (not shown). The conductive wires 206 are deployed to connect various the bonding pads with corresponding conductive traces so that the chipset 204 and the carrier 202 are electrically connected together.

The carrier 202 is a Printed Circuit Board (PCB). The area and thickness of the carrier 202 is arbitrary and can be selected according to practical needs. A plurality of conductive traces is orderly formed on the first surface of the carrier 202. A plurality of pinouts 216 is disposed on the second surface of the carrier 202. The conductive traces can be connected to the external circuit via the pinouts 216.

The chipset 204 can be a semiconductor chip, and arbitrarily selected from RAM, DRAM or other kind of ICs. The semiconductor chip is a power transistor in the present embodiment. The size of the semiconductor chip is arbitrary and can be selected according to practical needs.

The conductive wire 206 can be made of metal or carbon nanotubes. The conductive wire 206 is made of gold in the present embodiment.

The material of the encapsulating layer 208 is resin, such as ethoxyline resin. The thickness of the encapsulating layer 208 is arbitrary and can be selected according to practical needs. The encapsulating layer 208 is formed on the carrier 202 by printing technology to cover the chipset 204 and the conductive wires 206 by printing technology.

Figure 2:
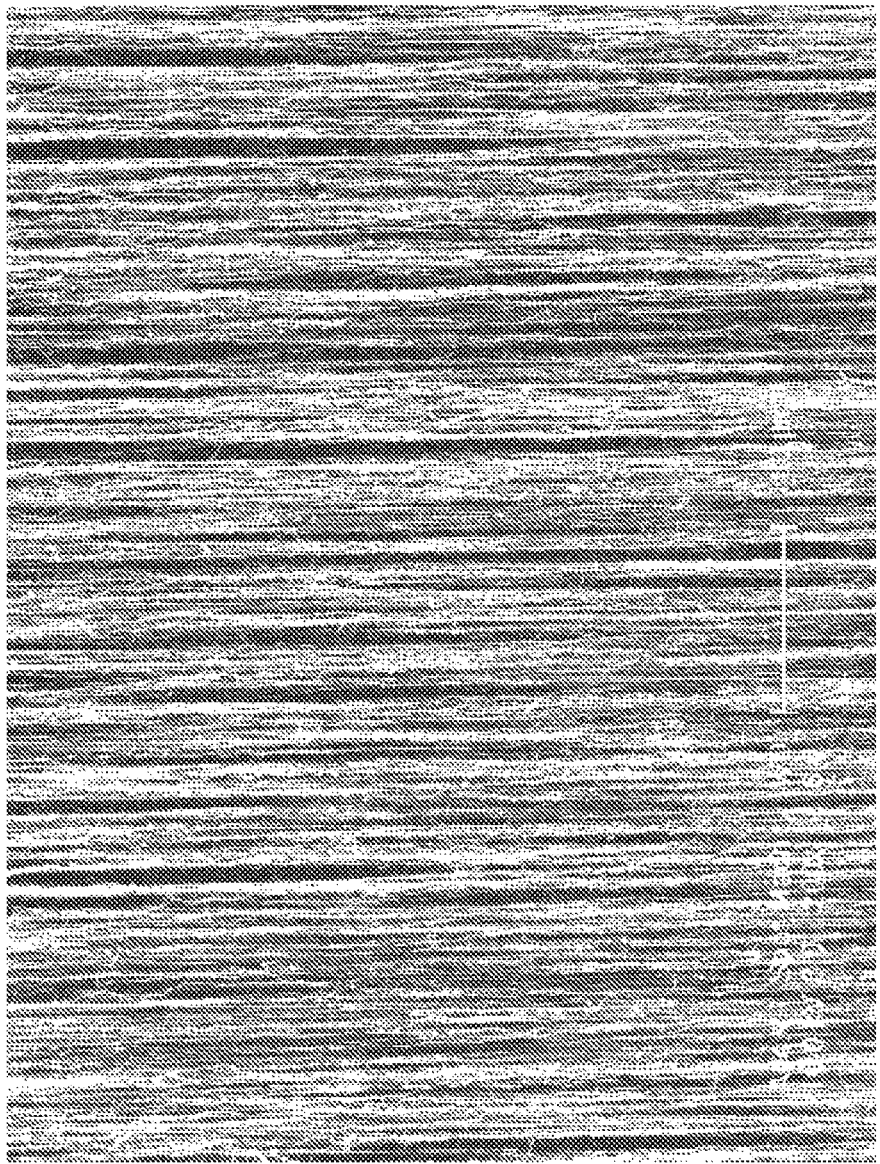
FIG. 2 is a Scanning Electron Microscope (MEM) image of a nanotube film.
Figure 3:
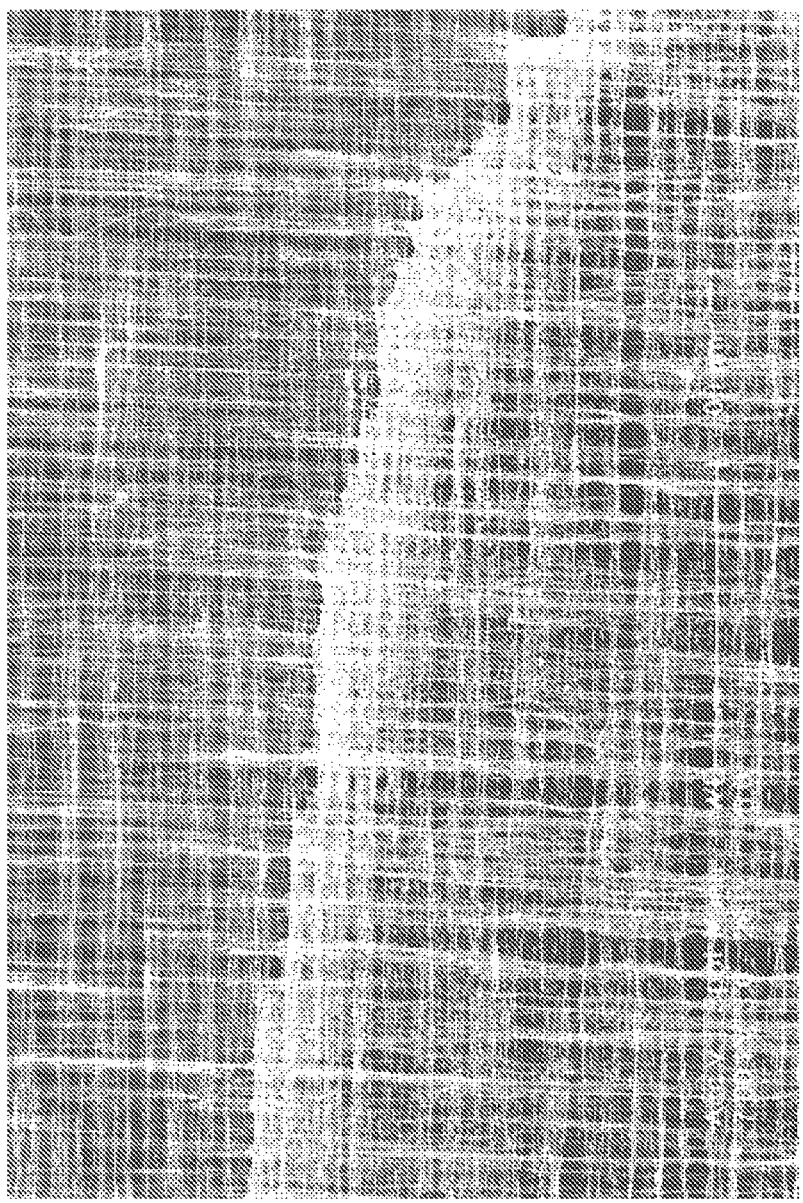
FIG. 3 is an SEM image of two stacked carbon nanotube films.
Figure 4:
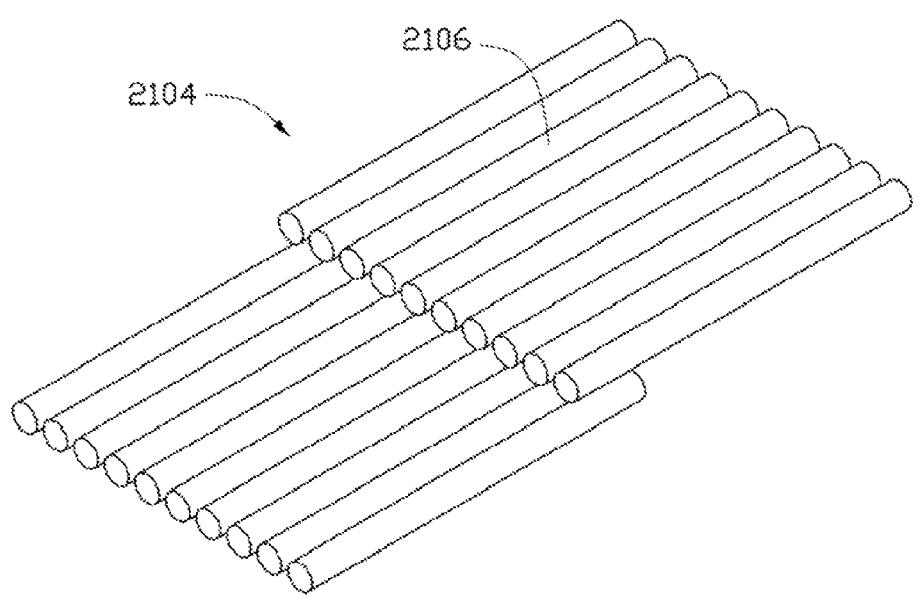
FIG. 4 is a schematic view of a carbon nanotube segment in the carbon nanotube film of FIG. 2.

The electromagnetic shielding layer 210 includes a carbon nanotube film structure. The carbon nanotube film structure includes one carbon nanotube layer 2102 as shown in FIG. 2 or at least two stacked carbon nanotube layers 2102 as shown in FIG. 3. Adjacent carbon nanotube layers 2102 connect to each other by van der Waals attractive force therebetween. Each carbon nanotube layer 2102 is substantially one carbon nanotube thick, and can include one carbon nanotube film or two coplanar carbon nanotube films contactingly located side-by-side. Adjacent carbon nanotube films connect to each other by van der Waals attractive force therebetween. There may be some overlap between adjacent coplanar films. A thickness of the carbon nanotube film approximately ranges from 0.5 nanometers to 100 micrometers. The area and thickness of the carbon nanotube film structure is unlimited and could be made according to practical needs. Various dimensions of carbon nanotube film structures can be obtained by using various numbers and shapes of carbon nanotube film or be obtained by stacking a plurality of carbon nanotube films. The area of the carbon nanotube film structure is determined by the amount of carbon nanotube films in each carbon nanotube layer 2102. Additionally, the thickness of the carbon nanotube film structure is determined by the amount of carbon nanotube layers 2102 in the carbon nanotube film structure. Referring to FIG. 2 and 4, each carbon nanotube film includes a plurality of carbon nanotubes parallel to a surface thereof. Further, each carbon nanotube film includes a plurality of carbon nanotube segments 2104 joined successively end-to-end by van der Waals attractive force therebetween. Each carbon nanotube segment 2104 includes a plurality of carbon nanotubes 2106 closely arranged and in parallel to each other. The carbon nanotubes 2106 have the same length and are arranged in the same direction. The extending direction of the carbon nanotubes 2106 in any two adjacent carbon nanotube layers 2102 form an angle $\alpha$, where $0 \leq \alpha \leq 90°$. The carbon nanotube film structure includes a plurality of micropores distributed in the carbon nanotube film structure uniformly. The effective diameters of the micropores approximately ranges from 1 to 500 nanometers.

The carbon nanotubes in the carbon nanotube film are selected from the group consisting of single-walled carbon nanotubes, double-walled carbon nanotubes, and multi-walled carbon nanotubes. A diameter of each single-walled carbon nanotube approximately ranges from 0.5 to 50 nanometers. A diameter of each double-walled carbon nanotube approximately ranges from 1 to 50 nanometers. A diameter of each multi-walled carbon nanotube approximately ranges from 1.5 to 50 nanometers. A length of the carbon nanotubes is arbitrary and can be selected according to the practical needs. The length of the carbon nanotubes approximately ranges from 200 micrometers to 900 micrometers in the present embodiment.

The electromagnetic shielding layer 210 including carbon nanotube film structures can absorb the electromagnetic waves and dissipate the heat effectively. Also, the carbon nanotube film structures have excellent electrical conductivity.

The electromagnetic shielding layer 210 further includes a plurality of filling particles 220 filled in the carbon nanotube film structure. The filling particles 220 are distributed in the micropores of the carbon nanotube film structure or between the adjacent carbon nanotube layers. The filling particles 220 are selected from the group consisting of metal particles, alloy particles. In the present embodiment, the filling particles 220 are porous metal particles or porous alloy particles. The filling particles 220 are made of iron (Fe), cobalt (Co), nickel (Ni), copper (Cu) or any alloy thereof. A diameter of the filling particles 220 is less than 1 micrometer. The filling particles 220 are iron in the first embodiment. The filling particles 220 can absorb electromagnetic waves effectively thus increasing the electromagnetic shielding effect of the electromagnetic shielding layer 210.

The material of the protective layer 212 can be the same as or different from the material of the encapsulating layer 208. The thickness of the protective layer 212 is arbitrary and can be selected according to practical needs. The protective layer 212 is used to prevent the electromagnetic shielding layer 210 from being damaged.

Furthermore, a heat sink 214 is located on the protective layer 212. The heat sink 214 is used to dissipate the heat in the electromagnetic shielding layer 210. The heat sink 214 is made of metal or alloy. The heat sink 214 is a copper sheet or aluminum sheet. The heat sink 214 is optional because of the excellent thermal conductive property of the carbon nanotube film structure.

It is to be understood that a plurality of semiconductor package preforms 218 can be packaged on the same carrier 202. Each semiconductor package preform 218 is covered by one electromagnetic shielding layer 210 and each electromagnetic shielding layer 210 is covered by one protective layer 212. Each protective layer 212 is contacted with one heat sink 214.

Figure 5:
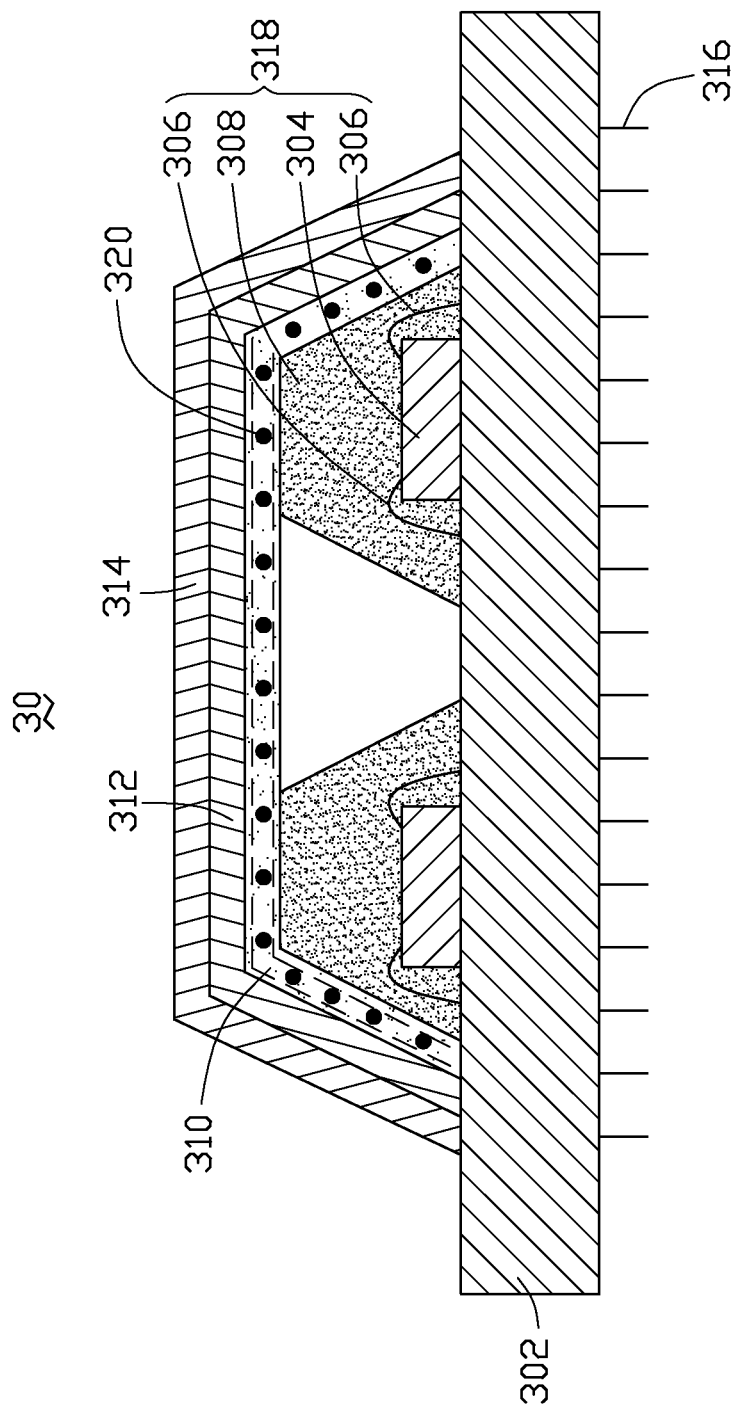
FIG. 5 is a schematic view of a chipset package structure in accordance with the second embodiment.

Referring to FIG. 5, a chipset package structure 30 is provided in a second embodiment. The chipset package structure 30 includes a carrier 302 comprising a first surface and a second surface, at least two semiconductor package preforms 318, an electromagnetic shielding layer 310, and a protective layer 312. A plurality of conductive traces (not shown) is disposed on/in the carrier 302. A plurality of pinouts 316 is disposed on the first surface of the carrier 302 and electrically connected to the conductive traces. The at least two semiconductor package preforms 318 are separately disposed on the second surface of the carrier 302 and electrically connected to the conductive traces. The space between the adjacent two semiconductor package preforms 318 is filled with resin. The electromagnetic shielding layer 310 is formed over the semiconductor package preforms 318 to cover all the semiconductor package preform 318. The protective layer 312 is configured to cover the whole electromagnetic shielding layer 310. The semiconductor package preform 318 includes a chipset 304, a plurality of conductive wires 306, and an encapsulating layer 308 covering the chipset 304 and the conductive wires 306. The chipset 304 includes a plurality of bonding pads (not shown). The conductive wires 306 are deployed to connect various bonding pads to corresponding conductive traces to electrically connect the chipset 304 to the carrier 302.

The electromagnetic shielding layer 310 includes a carbon nanotube film structure. The electromagnetic shielding layer 310 further includes a plurality of filling particles 320 distributed in the carbon nanotube film structure. The carbon nanotube film structure and the filling particle 320 are same with the carbon nanotube film structure and the filling particle 220 in the first embodiment.

It is to be understood that the chipset package structure 30 includes a heat sink 314 located on the protective layer 312. The material of the heat sink 314 is the same material used for the heat sink 214 in the first embodiment.

Figure 6:
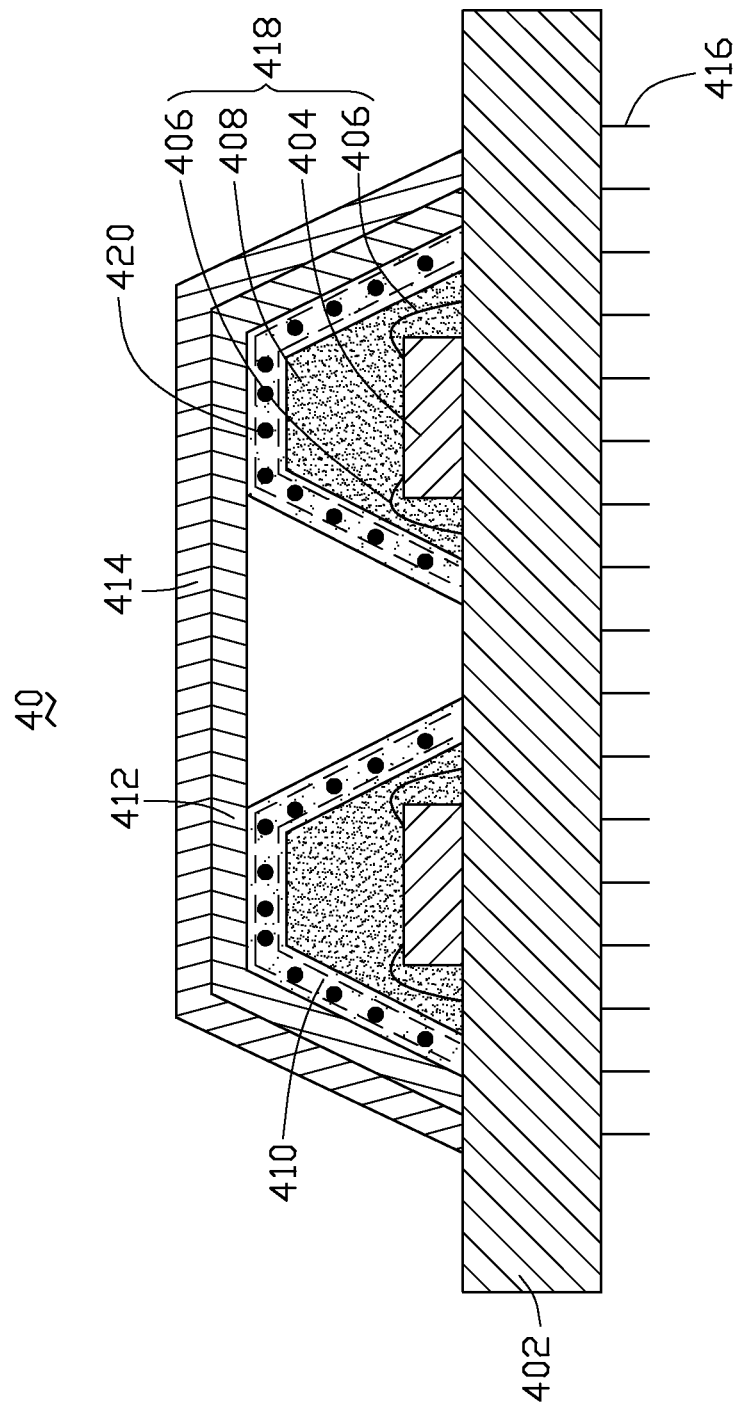
FIG. 6 is a schematic view of a chipset package structure in accordance with the third embodiment.
Figure 7:
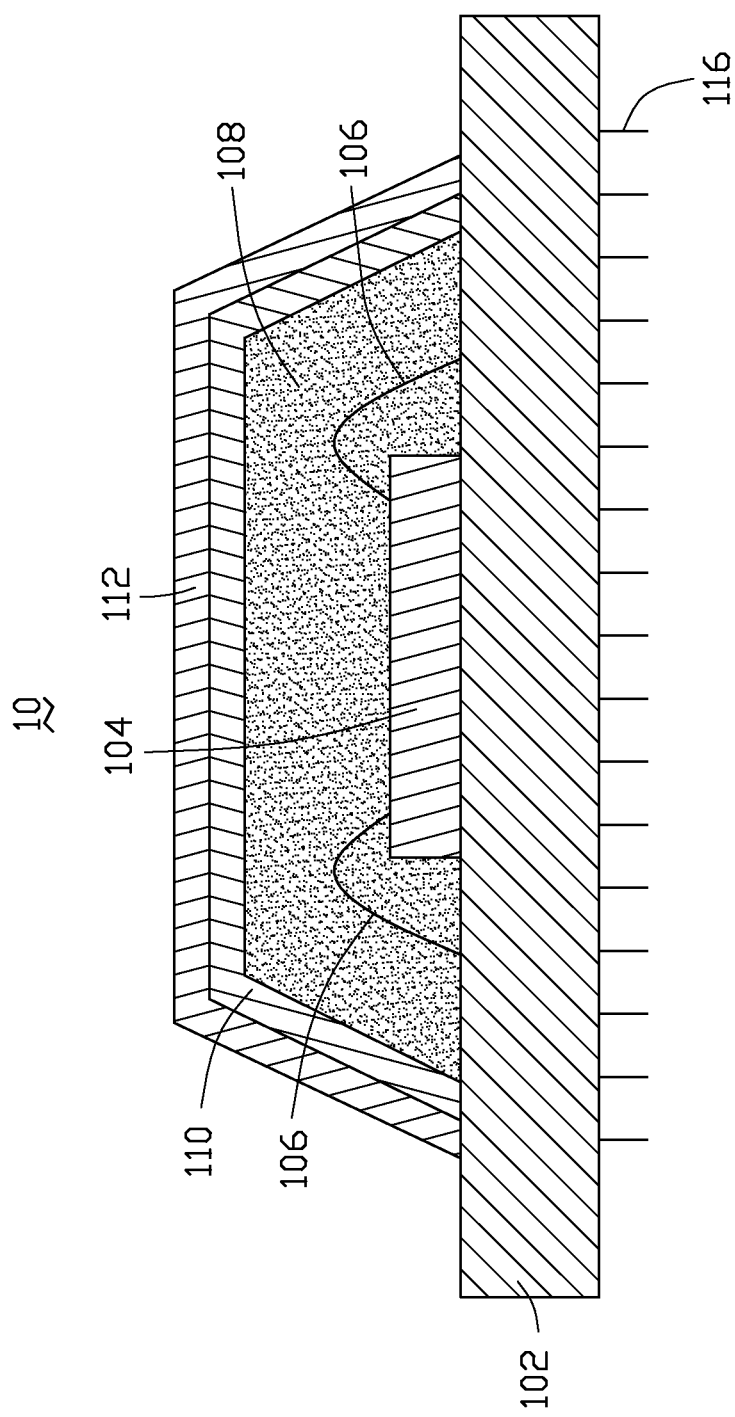
FIG. 7 is a schematic view of a conventional chipset package structure according to the prior art.

Referring to FIG. 6, a chipset package structure 40 is provided in the third embodiment. The chipset package structure 40 includes a carrier 402 comprising a first surface and a second surface, at least two semiconductor packages preforms 418, at least two electromagnetic shielding layers 410, and a protective layer 412. A plurality of conductive traces (not shown) is disposed on/in the carrier 402. A plurality of pinouts 416 is disposed on the first surface of the carrier 402 and electrically connected to the conductive traces. The at least two semiconductor package preforms 418 are disposed on the second surface of the carrier 402 separately and electrically connected to the conductive traces. Each semiconductor package preform 418 is covered by one electromagnetic shielding layer 410. The protective layer 412 covers all of the electromagnetic shielding layer 410. The semiconductor package preform 418 includes a chipset 404, a plurality of conductive wires 406, and an encapsulating layer 408 covering the chipset 404 and the conductive wires 406. The chipset 404 includes a plurality of bonding pads (not shown). The conductive wires 406 are deployed to connect various bonding pads to corresponding conductive traces so that the chipset 404 is electrically connected to the carrier 402.

The electromagnetic shielding layer 410 includes a carbon nanotube film structure. The electromagnetic shielding layer 410 further includes a plurality of filling particles 420 distributed in the carbon nanotube film structure. The carbon nanotube film structure and the filling particle 420 are same with the carbon nanotube film structure and the filling particle 220 in the first embodiment.

It is to be understood that the chipset package structure 40 includes a heat sink 414 located on the protective layer 412. The material of the heat sink 414 is the same material used for the heat sink 214 in the first embodiment.

In use, the electromagnetic shielding layer of the chipset package structure, is electrically connected to ground. The carbon nanotube film structure and the filling particles in the carbon nanotube film structure can prevent the electromagnetic waves from escaping via absorption and reflection.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A chipset package structure comprising:
a carrier;
a plurality of pinouts;
at least one semiconductor package preform located on the carrier and electrically connected to the plurality of pinouts;
at least one electromagnetic shielding layer adjacent to the semiconductor package preform and at least one of the electromagnetic shielding layer comprising a carbon nanotube film structure, wherein the carbon nanotube film structure is in direct contact and cooperates with the carrier to form an enclosed space to accommodate the at least one semiconductor package perform, the carbon nanotube film structure comprises a plurality of carbon nanotubes parallel to a surface of the at least one electromagnetic shielding layer and arranged along the same direction, and the enclosed space is capable of preventing electromagnetic waves from escaping.

2. The chipset package structure as claimed in claim 1, wherein the carbon nanotube film structure comprises at least one carbon nanotube layer, and each carbon nanotube layer comprises a plurality of carbon nanotubes aligned along the same direction and parallel to a surface of the carbon nanotube layer.

3. The chipset package structure as claimed in claim 2, wherein the carbon nanotube film structure comprises at least two stacked carbon nanotube layers, and adjacent carbon nanotube layers are joined with each other by van der Waals attractive force therebetween.

4. The chipset package structure as claimed in claim 3, wherein an aligned direction of the carbon nanotubes in any two adjacent carbon nanotube layers forms an angle $\alpha$, and $0 \leq \alpha \leq 90°$.

5. The chipset package structure as claimed in claim 2, wherein each carbon nanotube layer comprises one carbon nanotube film or at least two coplanar carbon nanotube films located side-by-side, and adjacent carbon nanotube films joined with each other by van der Waals attractive force therebetween.

6. The chipset package structure as claimed in claim 5, wherein a thickness of the carbon nanotube film approximately ranges from 0.5 nanometers to 100 micrometers.

7. The chipset package structure as claimed in claim 5, wherein each carbon nanotube film comprises a plurality of carbon nanotube segments joined successively end-to-end by van der Waals attractive force therebetween.

8. The chipset package structure as claimed in claim 7, wherein each carbon nanotube segment comprises a plurality of carbon nanotubes being closely arranged and being parallel to each other.

9. The chipset package structure as claimed in claim 8, wherein the carbon nanotubes in the carbon nanotube film are selected from the group consisting of single-walled carbon nanotubes, double-walled carbon nanotubes, and multi-walled carbon nanotubes.

10. The chipset package structure as claimed in claim 8, wherein a diameter of the carbon nanotubes approximately ranges from 0.5 to 50 nanometers, and a length of the carbon nanotubes approximately ranges from 200 micrometers to 900 micrometers.

11. The chipset package structure as claimed in claim 3, wherein the carbon nanotube film structure comprises a plurality of micropores distributed therein uniformly, and the effective diameters of the micropores approximately range from 1 nanometer to about 500 nanometers.

12. The chipset package structure as claimed in claim 11, wherein the electromagnetic shielding layer further includes a plurality of filling particles distributed in the carbon nanotube film structure.

13. The chipset package structure as claimed in claim 12, wherein the filling particles are distributed in the micropores of the carbon nanotube film structure.

14. The chipset package structure as claimed in claim 12, wherein the filling particles are distributed between the adjacent carbon nanotube layers.

15. The chipset package structure as claimed in claim 12, wherein the material of the filling particles are selected from the group consisting of iron, cobalt, nickel, copper and any alloy thereof, and a diameter of the filling particle is less than 1 micrometer.

16. The chipset package structure as claimed in claim 1, further comprising a protective layer covering the electromagnetic shielding layer.

17. The chipset package structure as claimed in claim 1, further comprising at least two semiconductor package preforms and one electromagnetic shielding layer, and the electromagnetic shielding layer covers all of the semiconductor package preforms.

18. The chipset package structure as claimed in claim 1, further comprising at least two semiconductor package preforms and at least two electromagnetic shielding layers, and each electromagnetic shielding layer covers the corresponding one semiconductor package preform.

19. A chipset package structure comprising:
a carrier;
a plurality of pinouts;

at least one semiconductor package perform located on the carrier and electrically connected to the plurality of pinouts, wherein the at least one semiconductor package perform has a bottom surface contacting a surface of the carrier, a top surface opposite to the bottom surface, and a profile connecting the bottom surface and the top surface;

at least one electromagnetic shielding layer adjacent to the at least one semiconductor package perform, wherein the at least one of the electromagnetic shielding layer comprises a carbon nanotube film structure, and the carbon nanotube film structure is located on and covers both the top surface and the profile of the at least one semiconductor package perform, and capable of preventing electromagnetic waves from escaping;

wherein the carbon nanotube film structure comprises a carbon nanotube film, and the carbon nanotube film comprises a plurality of carbon nanotubes parallel to a surface of the at least one electromagnetic shielding layer and arranged in the same direction.

20. The chipset package structure as claimed in claim 19, wherein the carbon nanotube film comprises a plurality of carbon nanotube segments jointed successively end-to-end by van der Waals attractive force therebetween and extend along a direction parallel to the top surface and the profile of the at least one semiconductor package perform.

* * * * *